United States Patent [19]
Ross et al.

[11] Patent Number: 4,647,908
[45] Date of Patent: Mar. 3, 1987

[54] CODEWORD DECODING

[75] Inventors: Peter F. Ross; Ian W. Rodgers; Rupert L. A. Goodings, all of Cambridge, England

[73] Assignee: Crosfield Electronics Limited, London, England

[21] Appl. No.: 680,018

[22] Filed: Dec. 10, 1984

[30] Foreign Application Priority Data

Dec. 8, 1983 [GB] United Kingdom ................. 8332772

[51] Int. Cl.[4] ............................................. H03M 7/42
[52] U.S. Cl. ............................................. 340/347 DD
[58] Field of Search ................. 340/347 DD; 358/261

[56] References Cited

U.S. PATENT DOCUMENTS 3,701,111 10/1972 Cocke .......................... 340/347 DD
4,312,018 1/1982 Nakajiri .............................. 358/261

FOREIGN PATENT DOCUMENTS 0079565 6/1980 Japan .................................... 358/261

OTHER PUBLICATIONS

McCray "IBM Technical Disclosure Bulletin" vol. 17 No. 11 Apr. 1975 cited by Applicant Copy in S.L.

Primary Examiner—Charles D. Miller
Attorney, Agent, or Firm—Sughrue, Mion, Zinn, Macpeak and Seas

[57] ABSTRACT

A method and apparatus for decoding a digital codeword of a codeword system comprising digital codewords of varying length in which no short codeword forms the prefix of a longer codeword in the same system comprises detecting with means (26) whether the codeword has a predetermined prefix, the predetermined prefix being shorter than any codeword containing it. Further means (26) are provided for decoding only the suffix of the codeword or the entire codeword respectively according to whether or not the predetermined prefix is detected.

11 Claims, 1 Drawing Figure

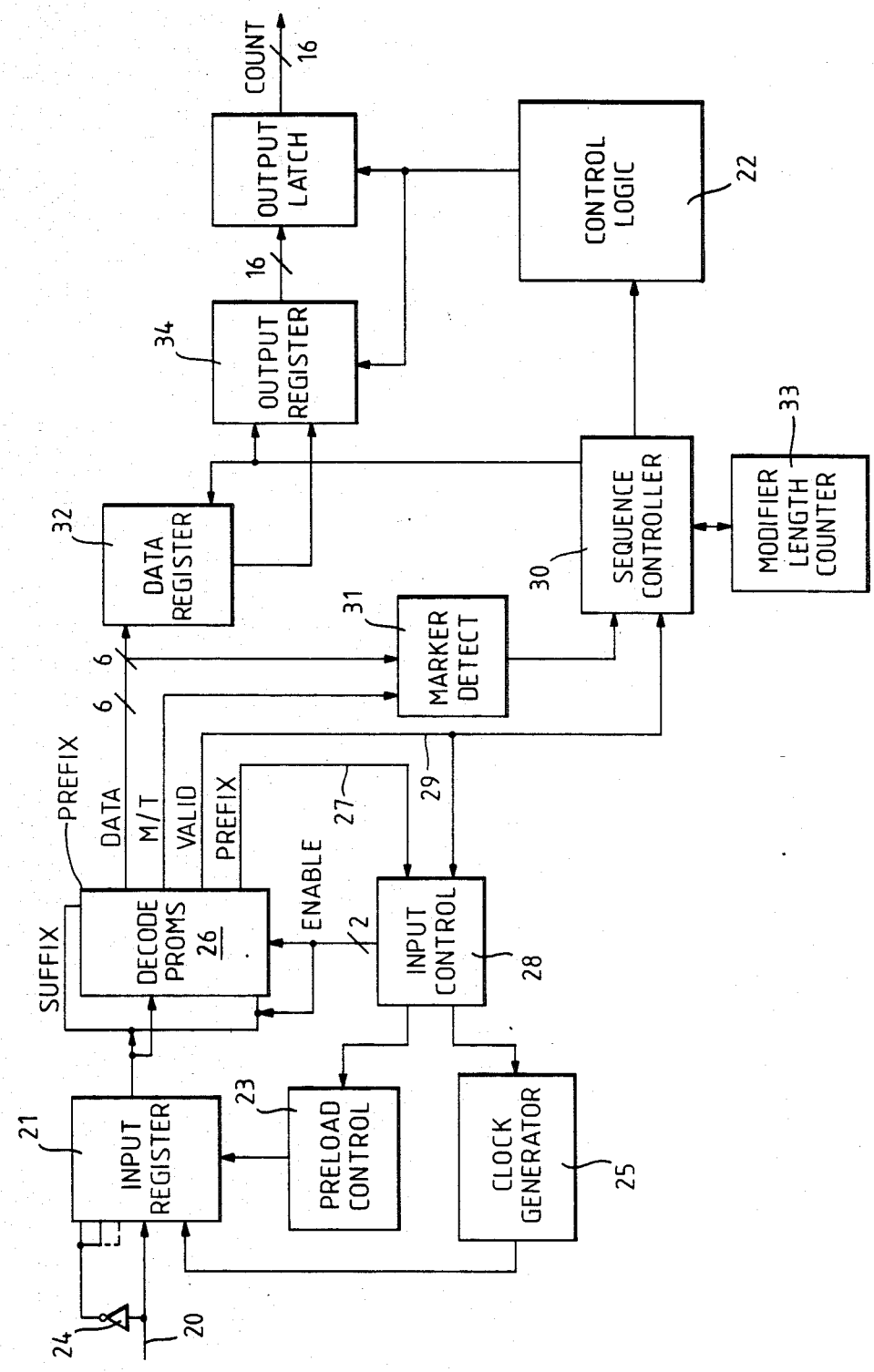

CODEWORD DECODING

The invention relates to methods and apparatus for decoding digital codewords of a codeword system.

In the field of picture (including text) storage and transmission, it is conventional practice to scan the picture line by line to determine run lengths of colours in each line and then to code this information in order to minimise storage space or transmission time. One code system which has been devised in an attempt to optimise storage space and transmission is the modified "Huffman" (MH) code system as described in Recommendation T.4-"Standardisation of Group III Facsimile Apparatus for Document Transmission" published by the CCITT. One of the main drawbacks of this system is that the rules which the codewords in the code system obey necessarily force the generation of relatively long codewords which have to be used relatively frequently. In particular this concerns the rule that no short codeword forms the prefix of a longer codeword in the same system. This rule exists to assist the decoding of a continuous stream of such codewords. This leads to the practical problem, that it is necessary to provide a large decode matrix, usually a PROM, in order to decode all the codewords in the code system. For high speed memory this is expensive and bulky.

One proposal for dealing with this problem is described in U.S. Pat. No. 3,701,111. In this disclosure a special form of code system is devised known as "constrained Huffman coding" in which codewords having a length equal to or greater than N have a prefix which is indicative of their length. This enables a certain degree of simplicity in the processing to be achieved but has the major disadvantage that a decoding system is not provided which can handle the conventional modified Huffman code systems already in use. With this prior art it is necessary for the encoding system also to be specially adapted to generate the constrained Huffman code.

In accordance with one aspect of the present invention, a method of decoding a digital codeword of a codeword system comprising digital codewords of varying length in which no short codeword forms the prefix of a longer codeword in the same system comprises detecting whether the codeword has a predetermined prefix the predetermined prefix being shorter than any codeword containing it; and decoding only the suffix of the codeword or the entire codeword respectively according to whether or not the predetermined prefix is detected.

The inventors have recognised that it is often a characteristic feature of codeword systems as defined above, that the longer codewords all have the same prefix. For example, in the modified Huffman code system previously mentioned, a number of the longer codewords has the same prefix "000000".

Thus, one of the main advantages of this invention is that it can be used to decode codewords of existing code systems without any changes in the code system or encoding circuitry being required. Furthermore, the method may be used to decode codewords of a code system in which at least one group of codewords of different lengths have the same prefix. In the prior art, it is essential that the same prefix is only used with codewords of the same length. This in itself can increase the complexity of the code system.

Another important advantage of the invention lies in the fact that decoding is accomplished in two stages. If a long codeword is to be decoded, the prefix is detected and the suffix is then decoded by itself. Alternatively, if a prefix is not detected, then the entire codeword is decoded immediately. This results in greatly reduced requirements for the memory of the decoding system and leads to a considerable increase in processing speed.

In some examples, the method may further comprise detecting whether the codeword has one of a number of predetermined prefixes.

The method may further comprise detecting whether the suffix has a predetermined prefix; and decoding only the sub-suffix of the suffix of the codeword or the entire suffix of the codeword respectively according to whether or not the predetermined prefix is detected.

This procedure can be extended to further layers of decoding as required. The technique is very useful where the codeword lengths occur in ranges, with one level of suffix for each range of length.

In accordance with a second aspect of the present invention, apparatus for decoding an original codeword of a codeword system in which no short codeword forms the prefix of a longer codeword in the same system comprises means for detecting whether the codeword has a predetermined prefix the predetermined prefix being shorter than any codeword containing it; and means for decoding only the suffix of the codeword or the entire codeword respectively according to whether or not the predetermined prefix is detected.

Preferably, the decoding means comprises first means for decoding the prefix of the entire codeword as required; and second means for decoding the suffix.

Conveniently, the decoding means are provided by PROMs.

A further important advantage of this system is that in general with codeword systems as hereinbefore defined, longer codewords generally occur less frequently than shorter codewords. Since the means for decoding the suffix is not therefore frequently used, it may use slower and cheaper elements than the mean for decoding the prefix with only a small penalty on system performance.

An example of the considerable simplification which can be achieved with this invention can be appreciated by considering the requirements for decoding 16 bit codewords. In previous systems, this would require $2^{16} \times m = 64K \times m$ bits of PROM for a direct decode. However, with the apparatus of the invention, the codeword is reorganised as an 8 bit suffix in which case $2^8 \times m + 2^8 \times m$ bits of PROM are needed, i.e. only $512 \times m$ bits.

This invention is particularly applicable for use with the inventions described and claimed in our copending U.S. patent applications of even date entitled "Data Coding" and Detecting Codewords".

An example of a method and apparatus in accordance with the invention will now be described with reference to the accompanying drawing, in which:

FIG. 1 is a block circuit diagram.

The drawing illustrates a circuit for decoding codewords of the Huffman type, and particularly codewords forming the code system shown in the Table below.

TABLE

| CODEWORD TYPE | RUN | PREFIX | SUFFIX |
|---|---|---|---|
| T | 0 | 00001 | |

TABLE-continued

| CODEWORD TYPE | RUN | PREFIX | SUFFIX |
|---|---|---|---|
| T | 1 | 01 | |
| T | 2 | 001 | |
| T | 3 | 100 | |
| T | 4 | 110 | |
| T | 5 | 0001 | |
| T | 6 | 1110 | |
| T | 7 | 1111 | |
| M | 0 | 0000000 | 0001 |
| M | 1 | 101 | |
| M | 2 | 000001 | |
| M | 3 | 0000001 | |
| M | 4 | 0000000 | 1 |
| M | 5 | 0000000 | 01 |
| M | 6 | 0000000 | 0000 |
| M | 7 | 0000000 | 001 |

M and T indicate that the codeword is a make-up codeword or a terminator codeword respectively.

The codewords themselves are in binary form for ease of electrical representation and it will be seen that all the terminator codewords comprise a prefix only while some of the make-up codewords include additionally a suffix.

It should be noted that the prefix of any codeword in the code system is not the same as a complete shorter codeword enabling the codewords to be uniquely identified in a continuous bit stream as previously described.

This code system is based on a multiplicative modifier of eight. The invention is equally applicable for use with code systems based on additive modifiers such as the MH system.

As will be apparent from the Table, the codewords have a variable length and are supplied in serial form along a line 20 to an eight bit input shift register 21. Other Huffman type code systems could also be decoded. The only requirement is that no short codeword forms the prefix of a longer codeword. The codewords may have been received from a remote device of conventional form for generating MH codes or from the encoding device shown in FIG. 1 of our copending U.S. patent application of even date entitled "Data Coding" and the decoding circuit shown may be part of a Crosfield DATRAX 760 system in which case the codes represent scan run lengths or for example text. Overall operation of the decoder is under the control of control logic 22 although connections between the control logic 22 and a majority of the other circuit elements have been omitted for clarity.

One of the problems with decoding variable length codewords is in determining the beginning of a codeword which is wholly or partly contained in the input register 21. This problem is solved by setting a preload control latch 23 just before a new codeword is to be loaded into the input register 21. The setting of the preload control latch 23 enables the parallel input of the input register 21. The incoming data representing the codeword is also applied to the input register 21 in parallel via an inverter 24. Since the parallel input of the input register 21 is enabled the register 21 will be preloaded with the logical complement of the leading bit of the incoming codeword. Immediately thereafter i.e. after one clock cycle the preload control latch 23 is reset which in turn enables the shift input of the input register 21 and the incoming codeword is shifted in series into the input register 21 under the control of a clock generator 25.

The preloading of the input register 21 has the effect of locating the start of an incoming codeword since this will occur at the first transition between data of one type in the input register 21 and data of the complemental type.

In theory, the amount of PROM address space needed to decode Huffman codewords of up to 16 bits is about 64K. This is unworkable in practice and the circuit illustrated in the drawing provides a solution to this problem. The solution uses the fact that all codewords in the code system shown in the Table which have a length greater than 7 bits have an identical (predetermined) prefix which, in this case, is "0000000". In fact, the code system has been designed to have this property.

It should be noted that the longest codeword or portion (prefix) of a codeword which is decoded in one step is 7 bits and so the input register has a size of eight bits. This is one more than the maximum size required, to enable the detection of the start of a codeword or codeword portion (as previously described).

After each shift of data into the input register 21, the data in the register 21 is used to address a set of prefix and suffix decode PROMs 26.

In practice, the decode PROMs 26 will be programmed so that each accessible address will correspond to the contents of the input register 21 corresponding to the presence of a full valid codeword in the input register or a prefix as described below.

Initially the prefix PROMs are enabled by an input control latch 28 and addressed. If the contents of the input register 21 is recognised by the decode PROMs 26 as a prefix, the decode PROMs 26 issue an appropriate signal (PREFIX) on a line 27 to the input control latch 28. This is set accordingly which in turn sets the preload control latch 23 which enables the parallel input of the input register 21 as previously explained. The remaining portion of the incoming codeword is then shifted into the input register 21 after initial preloading with the logical complement of the leading bit and again, after each shift as controlled by the clock generator 25, the contents of the input register 21 are applied to the decode PROMs 26. In this case, however, the suffix PROMs are enabled by the setting of the input control latch 28 while the prefix PROMs are disabled. If the full suffix has not yet been shifted into the input register 21 the suffix PROMs will not detect a valid suffix and shifting will continue. Once a valid suffix is detected a corresponding output signal (VALID) will be supplied along a line 29 to the input control latch 28 which is reset and to a sequence controller 30. The resetting of the input control latch 28 stops further shifting of data into the input register 21 and enables the prefix PROMs.

The detection of a valid suffix is also accompanied by the output of a signal (M/T) indicating whether the full codeword is a make-up codeword or a terminator codeword and this is fed to a marker detect latch 31. The data corresponding to the valid codeword detected is passed in parallel from the suffix PROMs to a data register 32 and to the marker detect latch 31.

If a prefix is not detected but instead a shorter codeword is being decoded then this will be decoded immediately by the prefix PROM which will remain enabled under the control of the input control latch 28 and as with the suffix case, data corresponding to the incoming codeword will be passed to the data register 32 and to the marker detect latch 31 while a "VALID" signal will be fed to the sequence controller 30 and to the input control 28 which will temporarily prevent any further codewords from being decoded.

Each portion of data supplied to the data register 32 will have a fixed length corresponding to the modifier length. In this case, with a modifier of 8, the modifier length will be 3. The modifier length is set in a modifier length counter 33 which is decremented by the sequence controller 30 as data in the data register 32 is serially shifted into an output register 34. While this shift is taking place the control logic 22 permits the input control latch 28 to allow the next portion of a codeword or the beginning of the next codeword to be loaded into the input register 21. After each portion of the incoming codeword has been decoded, the decoded data is shifted serially into the output register 34 until a full 16 bits are present in the output register 34. These are then shifted in parallel under the control of the control logic 22 to an output latch 35 from where the data can be fed as desired to storage or to further processing means.

The marker detect latch 31 senses for the presence of a make-up zero run length and in particular when this occurs as a first word of a run. This cannot happen in practice and is used during the encoding process to indicate the end of a block of run lengths. When such an end of block marker is detected the sequence controller 30 is disabled by the marker detect latch 31.

We claim:

1. Apparatus for decoding a digital codeword of a codeword system comprising digital codewords of varying length in which no short codeword forms the prefix of a longer codeword in the same system, said apparatus comprising means for detecting whether said codeword has a predetermined prefix, said predetermined prefix being shorter than any codeword containing it; and means for decoding one of the suffix only of said codeword and said entire codeword respectively according to whether or not said predetermined prefix is detected.

2. Apparatus according to claim 1, wherein said decoding means comprises first means for detecting said prefix and decoding said entire codeword as required; and second means for decoding said suffix.

3. Apparatus according to claim 1, wherein said decoding means are provided by PROMs.

4. A method of decoding a digital codeword of a codeword system comprising digital codewords of varying length in which no short codeword forms the prefix of a longer codeword in the same system, said method comprising:
   (i) loading a first memory with a number of bits of an incoming codeword, said number of bits being no greater than the number of bits in a first predetermined prefix, said first predetermined prefix being shorter than any codeword containing it;
   (ii) causing said loaded bits to address a location of a second memory containing, at each location whose address corresponds to a complete codeword, data representing the decoded codeword, and at each location whose address corresponds to a prefix, data defining the prefix; and
   (iii) (a) where a complete codeword is loaded in said first memory, reading the contents of said addressed location of said second memory;
   (b) where a prefix is loaded in said first memory, causing the remaining bits of said codeword, defining a suffix of said codeword, to address a third memory containing at each location whose address corresponds to a suffix, data representing the decoded codeword; and reading the contents of said addressed location of said third memory.

5. A method according to claim 4, wherein said first memory is loaded in step (i) by serially shifting digital data into said first memory, said second memory being addressed in step 2 after each shift.

6. A method according to claim 5, wherein said step iii(b) comprises shifting said remaining bits of said codeword in series into said first memory and addressing said third memory after each shift.

7. A method according to claim 4, wherein said method is adapted to decode codewords having one of a number of predetermined prefixes.

8. A method according to claim 4, further comprising detecting whether said suffix has a second predetermined prefix; and decoding one of the sub-suffix only of the suffix of the codeword and said entire suffix of said codeword respectively according to whether or not said second predetermined prefix is detected.

9. Apparatus for decoding a digital codeword of a codeword system comprising digital codewords of varying length in which no short codeword forms the prefix of a longer codeword in the same system, said apparatus comprising first, second, and third memories, said first memory being adapted to receive a number of bits of an incoming codeword, said number of bits being no greater than the number of bits in a first predetermined prefix, said first predetermined prefix being shorter than any codeword containing it; control means, said control means causing said bits loaded in said first memory to address a location of said second memory, said second memory being adapted to contain at each location whose address corresponds to a complete codeword data representing the decoded codeword and at each location whose address corresponds to a prefix data representing said prefix, said control means being responsive to the contents of the addressed location of said second memory to cause said contents to be read as representing a decoded codeword, or to cause the remaining bits of said codeword to be loaded into said first memory and thereafter to cause said loaded bits to address said third memory, said third memory being adapted to contain at each location whose address corresponds to a suffix, data representing a decoded codeword, and said control means being adapted to read the contents of said addressed location of said third memory.

10. Apparatus according to claim 8, wherein said second and third memories comprise PROMs.

11. Apparatus according to claim 8, wherein said first memory comprises a shift register.

* * * * *